United States Patent [19] [11] 3,783,420
Bastian [45] Jan. 1, 1974

[54] METHOD FOR COUPLING AND BANDPASS CONTROL IN UHF VARACTOR TUNERS

[75] Inventor: Elmer Bastian, Union, Ill.

[73] Assignee: Oak Industries, Inc., Crystal Lake, Ill.

[22] Filed: Nov. 20, 1972

[21] Appl. No.: 308,009

[52] U.S. Cl. .................. 334/39, 334/41, 333/82 R, 325/488
[51] Int. Cl. .......................... H03j 3/02, H01p 7/00
[58] Field of Search ............. 333/83 R, 82 R, 73 R, 333/98 R; 334/40–45, 39; 325/488

[56] References Cited

UNITED STATES PATENTS 2,465,639 3/1949 Edson ............................ 333/83 R

OTHER PUBLICATIONS

Cohn, S. B., "Dissipation Loss in Multiple-Coupled-Resonator Filters," Pro. IRE, 8–1959, pp. 1343–1348.

*Primary Examiner*—Rudolph V. Rolinec
*Assistant Examiner*—Wm. H. Punter
*Attorney*—Alfred H. Plyer, Jr. et al.

[57] ABSTRACT

A method for optimizing coupling and bandpass control in UHF varactor tuners by using two or more types of plating materials.

10 Claims, 1 Drawing Figure

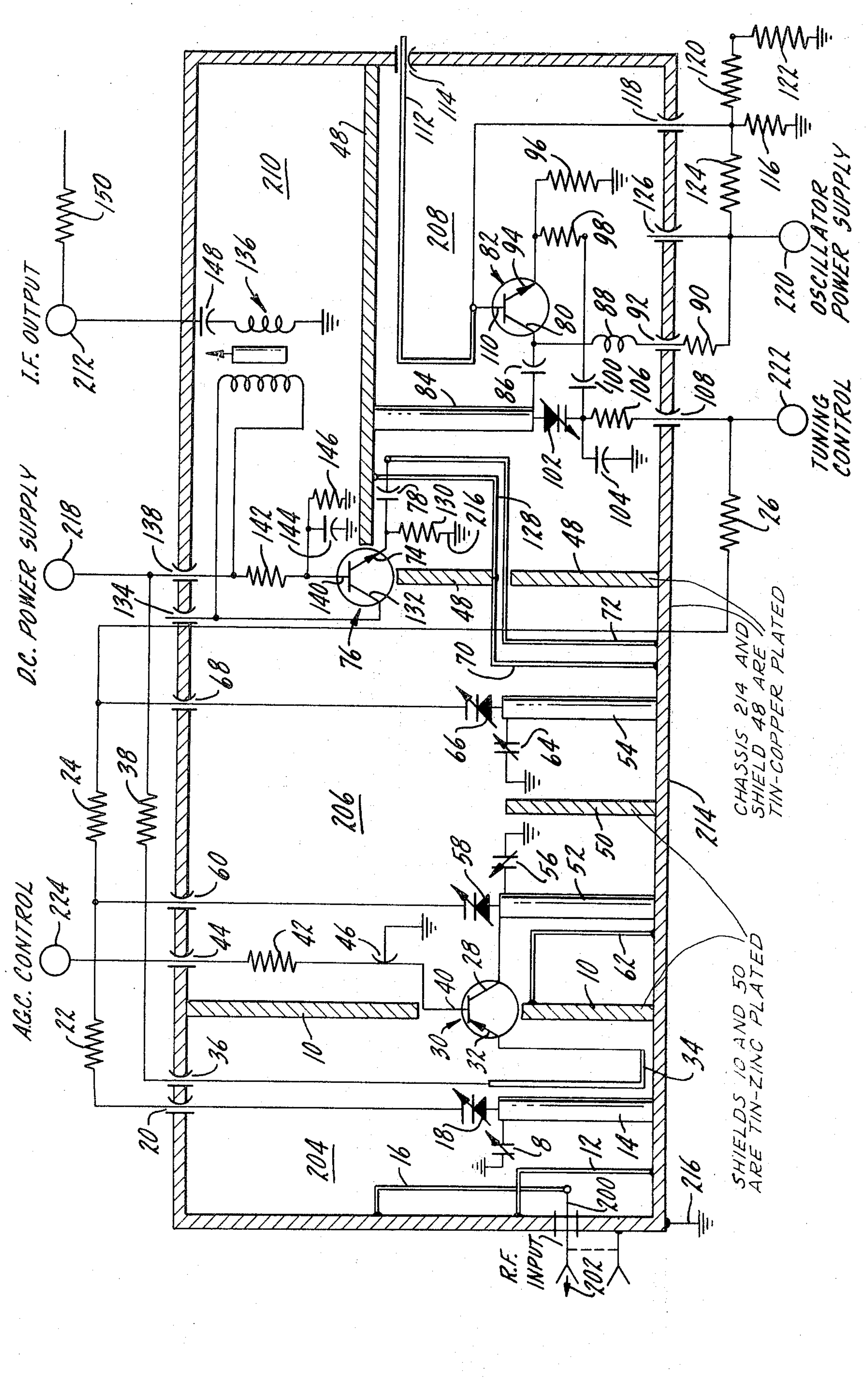
I.F. OUTPUT
D.C. POWER SUPPLY
A.G.C. CONTROL
OSCILLATOR POWER SUPPLY
TUNING CONTROL
R.F. INPUT
CHASSIS 214 AND SHIELD 48 ARE TIN-COPPER PLATED
SHIELDS 10 AND 50 ARE TIN-ZINC PLATED

METHOD FOR COUPLING AND BANDPASS CONTROL IN UHF VARACTOR TUNERS

SUMMARY OF THE INVENTION

This invention is in the field of resonant cavities and UHF tuners and is concerned with an improved method for optimizing characteristics such as bandwidth and interstage coupling by the use of two or more different plating materials on the chassis and various shields in the device.

A primary object is a method for plating resonant cavities to optimize bandwidth and interstage coupling.

Another object is an improved UHF varactor tuner using resonated lines for tuning elements.

Another object is optimization of electrical tracking in a UHF tuner for ease of manufacture.

Another object is an improved method of plating to obtain uniformity of resonator bandwidth and interstage coupling over the UHF band.

Other objects will appear from time to time in the ensuing specification, drawing and claims.

BRIEF DESCRIPTION OF THE DRAWING

The drawing is an electrical circuit diagram of an improved UHF tuner.

BRIEF DESCRIPTION OF THE INVENTION

The UHF tuner in the drawing receives UHF television signals via an antenna system and selects individual channels by means of a tunable wave filter. Operating as a conventional hetrodyne receiver, the signals are converted to an intermediate frequency by hetrodyning the oscillator and signal frequencies in a mixer. The difference frequency generated by the hetrodyne action, which is amplified by the mixer and band shaped by an output transformer, is the IF output.

The UHF tuner includes an RF input 200 which connects to an external antenna 202, an antenna tuning section 204, an interstage tuning section 206 between the antenna tuning section 204 and the oscillator tuning section 208, a mixer and output tuning section 210, and an IF output 212. The various sections are resonant cavities mechanically defined by shields at various points in the metal chassis 214 which is grounded at 216.

The UHF tuner also includes a DC power supply input 218 which supplies the antenna tuning section 204, the interstage tuning section 206 and the mixer and output tuning section 210. The DC supply 218 may be the 20 volts DC shown or other suitable values. The oscillator tuning section 208 has an independent DC power supply input 220 which may also be 20 volts DC. A tuning control input 222 is varied externally from approximately 2.5 to 28 volts DC by means of external tuning selection. An AGC control input 224 may also be included to facilitate gain control of the circuitry in the antenna tuning section 204.

The antenna tuning section 204 of the UHF tuner is defined by the chassis 214 and the metal shield 10, both of which are plated with a conductive material. An antenna tuning loop 12 formed from a piece of wire is connected between two suitable points on the chassis 214 as determined by calculation and experimentation to aid in tuning the antenna tuning section 204. A transmission line 14 forms the antenna resonator with chassis 214, shield 10 and a metal cover that is not shown which is placed over the chassis. An antenna input loop 16 is also made from a piece of wire and is connected between a suitable point on the chassis 214 and the antenna tuning section input 200. The anode of antenna tuning varactor 18 and one end of a trimmer capacitor 8 whose other end is connected to ground 216 are connected to the antenna tuning line 14. The cathode of varactor 18 is connected through the chassis 214 by means of a by-pass capacitor 20 and then through series-connected resistors 22, 24 and 26 to the tuning control input 222. The output of the antenna tuning section 204 is the collector 28 of a transistor 30 connected as an RF amplifier. The emitter 32 of RF amplifier transistor 30 is connected through an RF input loop 34 and through the chassis by means of feed-thru capacitor 36 to DC supply 218 through resistor 38. The base 40 of transistor 30 is connected through resistor 42 to the AGC control 224 and passes through the chassis 214 through by-pass capacitor 44. The base 40 is also connected to the chassis 214 through a by-pass capacitor 46.

The collector 28 of RF amplifier transistor 30 is the input of the interstage tuning section 206 which is mechanically defined by the chassis 214, the metal shield 10, the metal shield 48 and the circuitry of the mixer output tuning section 210. Another metal shield 50 is located within the interstage tuning section 206 and between an RF output tuning line 52 and a mixer input tuning line 54 which are both transmission lines sections so as to divide the interstage tuning section into two areas. One end of the RF output tuning line 52 is connected to the chassis 214 and the other end is connected to the collector 28 of RF amplifier transistor 30, to the chassis ground through trimmer capacitor 56 and to the anode of RF output tuning varactor 58. The cathode of varactor 58 is connected through the chassis by means of by-pass capacitor 60 to the tuning control 222 through series resistors 24 and 26. An RF tuning loop 62 is located near the RF output tuning line 52 between the chassis 214 and the metal shield 10 at a point near the RF amplifier transistor 30. The mixer input tuning line 54 has one end connected to the chassis 214 and the other end connected to chassis ground through trimmer capacitor 64 and to the cathode of mixer input tuning varactor 66. The anode of varactor 66 is connected through the chassis by means of feed-thru capacitor 68 to the tuning control 222 through series resistor 26. Located near the mixer input tuning line 54 is a mixer tuning loop 70 that has one end connected to the chassis and the other end connected to the shield 48. The output of the interstage tuning section 206, the mixer input loop 72, has one end connected to the chassis 214 with the other end passing through the metal shield 48 and connected to the emitter 74 of mixer transistor 76 through capacitor 78.

The oscillator tuning section 208 adjoins the interstage tuning section 206 and is mechanically defined by the chassis 214 and the metal shield 48. The collector 80 of oscillator transistor 82 is connected to one end of the oscillator tuning line 84 through coupling capacitor 86 and also to the oscillator power supply 220 through a series connection of a coil 88 and a resistor 90 and through the chassis 214 by means of a by-pass capacitor 92. The emitter 94 of oscillator transistor 82 is connected to ground 216 through resistor 96 and to one end of a resistor 98. The other end of resistor 98 is connected through a coupling capacitor 100 to the cathode of oscillator tuning varactor 102 whose anode is connected to the oscillator tuning line 84. The cathode of oscillator tuning varactor 102 is also connected to ground 216 through a capacitor 104 and to the tuning control 222 through resistor 106 and through the chassis by means of a by-pass capacitor 108. The base 110 of oscillator transistor 82 is connected through the oscillator AFC loop 112 whose other end is connected to a by-pass capacitor 114 mounted in the chassis 214. The base 110 is also connected to ground through resistor 116 after passing through the chassis by means of by-pass capacitor 118. Also connected at the ungrounded end of resistor 116 is a series resistor compensation network with resistor 120 and resistor 122 connected to ground 216 and to the oscillator power supply voltage 220 through resistor 124. The oscillator power supply voltage 220 is also connected to the chassis 214 through by-pass capacitor 126. An oscillator tuning loop 128 is connected between two suitable points on the chassis 214 near the mixer input loop 72 and the oscillator tuning line 84.

The mixer and output tuning section 210, adjoining the oscillator tuning section 208, is defined by the chassis 214 and metal shield 48. As described above, the emitter 74 of mixer transistor 76 is the input of the mixer and output tuning section 210 and is connected to ground 216 through a resistor 130. The collector 132 of mixer transistor 76 is connected to the chassis 214 through by-pass capacitor 134 and also to one end of the primary winding of the IF output transformer 136. The other end of the primary winding is connected to the power supply 218 through a by-pass capacitor 138, and to the base 140 of mixer transistor 76 through a resistor 142. The base 140 of mixer transistor 76 is also connected to ground 216 through the parallel combination of a capacitor 144 and a resistor 146. The secondary winding of the tunable IF transformer 136 has one end connected to ground 216 and the other end connected through coupling capacitor 148 to the output of the UHF tuner, the IF output 212. A matching resistor 150 may be connected to the IF output 212 as determined by the characteristics of the circuit to be connected at the output. A cover which is not shown fits over the entire UHF tuner chassis 214 to provide shielding and isolation between the various stages.

In operation the tuning control input 222 varies the DC voltage to the varactors 18, 58, 66 and 102 by means of a tuner selector which is external to the UHF tuner. The various sections and their associated circuitry are maximally tuned to the desired channel, channel 14 through channel 83, for optimum IF output at 212 and optimum rejection of undesired RF signals that are present at the antenna 202 and the RF input 200.

The UHF television signals at the antenna 202 enter the UHF tuner at the RF input 200. The antenna input loop 16 facilitates in the coupling of the RF energy to the antenna tuning line 14 which is tuned to desired frequency by the antenna tuning varactor 18 and the antenna trimmer capacitor 8. The antenna tuning loop aids in tuning the section 204 to the proper frequency at a given control input voltage. The resonant frequency to which the cavity is tuned is determined by the tuning voltage at the tuning control input 222 which is impressed across the varactor 18 through the bias network, resistors 22, 24 and 26. The capacity-voltage characteristics of the varactor 18 varies the reactance of the combination of antenna tuning line 14, varactor 18 and trimmer capacitor 8 which thereby changes the resonant frequency of the combination.

The RF energy in the resonant cavity section 204 is then coupled to the RF amplifier transistor 30 by the RF input loop 34 which is connected to the emitter 32. The amplified RF signal is then coupled from collector 28 of RF amplifier transistor 30 to the interstage tuning section 206 at the RF output tuning line 52. The RF tuning loop 62 aids in tuning the interstage tuning section 206 to the correct frequency. The interstage tuning section 206 also includes a mixer input tuning line 54 in addition to the RF output tuning line 52 which form mutually coupled resonators within the chassis 214, shields 10, 50 and 48, and the metal cover of the UHF tuner. The shield 50 between the tuning lines 52 and 54 divides the interstage tuning section 206 into two separate resonators and also controls the amount of mutual coupling between the lines. The frequency to which the mutually coupled resonators are tuned is determined by the tuning control voltage at 222 and the RF output tuning varactor 58, the mixer input tuning varactor 66 and trimmer capacitors 56 and 64 in the same way as the antenna tuning section 204.

The RF energy in the interstage tuning section 206 is then coupled to the mixer stage including mixer transistor 76 by means of the mixer input loop 72 which extends from the second resonant cavity near the mixer input tuning line 54 through shield 48 into the oscillator tuning section 208 where it is connected to the emitter 74 of mixer transistor 76 through coupling capacitor 78. The mixer tuning loop 70, which is connected between the chassis 214 near the mixer tuning line 54 and the metal shield 48 in the second resonant cavity, aids in tuning the interstage tuning section 206 to the proper frequency.

The emitter 74 of mixer transistor 76 is located within the oscillator tuning section 208 where the oscillator RF energy is coupled to the mixer transistor 76 from the oscillator resonator which includes the oscillator tuning line 84, the chassis 214, metal shield 48 and the UHF tuner cover. The tuning of the oscillator resonator is determined by the tuning control voltage 222 impressed across oscillator tuning varactor 102 in the same way as the previous sections. The oscillator tuning loop 128 connected between two points on the metal shield 48 aids in tuning the oscillator resonator to the proper frequency. The oscillator resonant frequency and the RF input frequency from the interstage tuning section 206 are both present at the emitter 74 of the mixer transistor 76 with the mixer and output tuning section 210 tuned to the difference mixing product of the RF input frequency and the oscillator frequency. The difference product obtained from the mixing operation is coupled through IF output transformer 136 as the IF output 212.

In UHF tuners as well as other devices utilizing resonant cavities, the surface conductivity of the metal shields and chassis influence the resonant cavity "Q." The resonator "Q"'s of the tuner affect the overall tuner bandwidth as will be explained in detail hereinafter. It is desirable to optimize the individual resonator "Q" characteristics of a UHF tuner to obtain a near uniform overall bandwidth over the frequency range of 473 MHz to 833 MHz or channel 14 to channel 83. This is done in the interest of obtaining uniform tuner performance over the UHF band. To optimize and control resonator "Q"'s, the metal chassis and metal shields are plated with certain conductive materials.

A lumped circuit equivalent of a pair of coupled resonant transmission lines may be substituted for the interstage coupling section 206 in the UHF tuner to determine these parameters analytically. The equivalent circuit of the interstage tuning section 206 will be that of a bandpass filter having two series loops with mutual coupling M between the two inductive elements which are the representations of the RF output tuning line 52 and the mixer input tuning line 54. The capacitive reactances of the RF output tuning varactor 58 and the mixer input tuning varactor 66 are also included in the loops. Along with the inductive portions of the transmission lines, the resistive losses are also represented with $R_{1u}$ being the resistive losses of the RF resonator section of the interstage tuning section 206 and $R_{2u}$ being the resistive losses of the mixer resonator section of the interstage tuning section 206. The various other input and output impedences and generator impedences are also included in the equivalent circuit but are not of primary interest. The coefficient of coupling, *k*, between the pair of resonators is a function of the mutual coupling which is fixed by the mechanical layout and $R_{1u}$ and $R_{2u}$ the resistive losses of the resonators. If *k*, the coupling coefficient, increases or decreases the pass bandwidth of the coupled resonators will also increase or decrease.

Therefore, it is desirable to have control of the parameters $R_{1u}$ and $R_{2u}$ so that a near uniform bandwidth of the UHF tuner or any other resonant cavity can be maintained over the desired frequency range. The magnitude of $R_{1u}$ and $R_{2u}$ at UHF frequencies are determined by the skin conductivity of the resonators and their cavities which is dependent on the conductive materials used in plating the chassis and the shields. The overall coupled bandwidth of the mutual coupled circuits such as in the interstage tuning section 206 is determined by the plating material conductivity.

It can be demonstrated analytically that *k* the "coefficient of coupling" and thus the coupled interstage bandwidth of section 206 is given by:

$$k = (4/\pi)\ \omega M/R1\mu \cdot R2\mu$$

where;

$\omega = 2\pi$ (frequency), and $M$ = Mutual coupling

We propose to control tuner bandwidths performance by selection of $R_{1u}$ and $R_{2u}$ through the selective use of chassis and shield plating materials. The effect of the plating materials on the bandwidth is also true of resonant cavities other than the mutual coupled circuits of the interstage tuning section 206 such as the UHF tuner antenna tuning cavity section 204 and oscillator tuning cavity section 208.

In the UHF tuner shown herein, with tin-zinc plated chassis 214 and shields 10, 50 and 48, the high end of the band of UHF frequencies had a response that was under-coupled and of narrow bandwidth. This condition is undesirable because the effect is difficult tuner tracking over the UHF frequency range. The tin-zinc plating used has an approximate composition of 78 percent tin and 22 percent zinc which are standard commercial formulations. When tin-copper was used as the plating conductor for the chassis 214 and the shields 10, 50 and 48, the high end of the UHF frequency band was very wide and of over-coupled response. This is also undesirable because it degrades the tuner performance on the high UHF frequencies corresponding to the higher TV channels. The tin-copper plating, known under various commercial terminologies such as Bronze Tin Copper, Golden Bronze, and Simulated Gold, has an approximate composition of 88 percent copper and 12 percent tin.

When the chassis 214 and the mixer oscillator shield 48 are plated with tin-copper and the RF shield 10 and the interstage shield 50 are plated with tin-zinc, uniform bandwidth and interstage coupling as well as overall tuner bandwidth over the entire UHF band is obtained. This is the ideal condition for optimum tuner performance and ease of manufacture concerning tracking of the circuitry.

Although the use of more than one plating material on various shields and chassis surfaces is described in a UHF tuner using tin-zinc and tin-copper as the plating materials, the method of optimizing uniform bandwidth, interstage coupling and electrical tracking should not be limited to the precise structures shown and may be applied to all resonant cavities whether used singularly or in coupled groups such as electromagnetic wave filters. Other standard plating materials such as cadmium, silver, rhodium, tin, copper, and nickel are examples of some of the plating materials that may be utilized as well as the tin-copper and tin-zinc described. The plating concept may also be extended to semi-conductors and dielectrics as well.

Whereas the preferred form of the invention has been shown and described herein, it should be realized that there may be many modifications, alterations and substitutions thereto.

I claim:

1. In a UHF tuner, a chassis, at least two cavities in said chassis, a shield between said cavities, one of said cavities including an antenna resonator, another of said cavities including mutually coupled RF amplifier and mixer resonators, a shield between said mutually coupled RF amplifier and mixer resonators, the shields and cavity walls being plated with dissimilar conductive materials to control the coupled bandwidth between the RF and mixer resonators and to control the bandwidth of the antenna resonator.

2. The UHF tuner of claim 1 further characterized in that said shields are plated with one conductive material and the chassis walls are plated with a second conductive material.

3. The UHF tuner of claim 2 further characterized in that said shields are plated with a tin-zinc conductive material and the chassis walls are plated with a tin-copper conductive material.

4. The UHF tuner of claim 3 further characterized in that said tin-zinc conductive material has proportions of on the order of about 78 percent tin and 22 percent zinc.

5. The UHF tuner of claim 3 further characterized in that said tin-copper conductive material has proportions of on the order of about 88 percent copper and 12 percent tin.

6. The method for optimizing characteristics of bandwidth, interstage coupling and overall tuned bandwidth in resonant cavities having a metal chassis forming the walls of the cavities and metal shields between the resonant cavities including the step of plating the shields and cavity walls with dissimilar conductive materials.

7. The method of claim 6 further characterized in that said shields are plated with one conductive material and the chassis walls are plated with a second conductive material.

8. The method of claim 7 further characterized in that said shields are plated with a tin-zinc conductive material and the chassis walls are plated with a tin-copper conductive material.

9. The method of claim 8 further characterized in that said tin-zinc conductive material has proportions of on the order of about 78 percent tin and 22 percent zinc.

10. The method of claim 8 further characterized in that said tin-copper conductive material has proportions of on the order of about 88 percent copper and 12 percent tin.

* * * * *